(12) United States Patent
Birnbaum et al.

(10) Patent No.: US 6,548,113 B1
(45) Date of Patent: Apr. 15, 2003

(54) VACUUM/GAS PHASE REACTOR FOR DEHYDROXYLATION AND ALKYLATION OF POROUS SILICA

(75) Inventors: Jerome Birnbaum, Richland, WA (US); Gary Maupin, Richland, WA (US); Glen Dunham, Kennewick, WA (US); Glen Fryxell, Kennewick, WA (US); Suresh Baskaran, Kennewick, WA (US)

(73) Assignee: Pacific Northwest Division, Richland, WA (US)

( * ) Notice: Subject to any disclaimer, the term of this patent is extended or adjusted under 35 U.S.C. 154(b) by 0 days.

(21) Appl. No.: 09/711,666

(22) Filed: Nov. 9, 2000

Related U.S. Application Data (63) Continuation-in-part of application No. 09/413,062, filed on Oct. 14, 1999, now Pat. No. 6,329,017, which is a continuation-in-part of application No. 09/361,499, filed on Jul. 23, 1999, now abandoned, which is a continuation-in-part of application No. 09/335,210, filed on Jun. 17, 1999, now abandoned, which is a continuation-in-part of application No. 09/220,882, filed on Dec. 23, 1998, now abandoned.

(51) Int. Cl.[7] .............................................. C23C 16/44
(52) U.S. Cl. ............................. 427/255.11; 427/255.26; 427/255.27; 427/255.18; 427/255.4; 427/294; 427/296; 438/781
(58) Field of Search ................... 427/255.11, 255.26, 427/255.27, 255.18, 255.4, 294, 296; 438/781

(56) References Cited

U.S. PATENT DOCUMENTS 5,847,443 A * 12/1998 Cho et al. ................... 257/40
6,165,905 A * 12/2000 Annapragada ............. 438/637
6,329,017 B1 * 12/2001 Liu et al. .................... 427/240

OTHER PUBLICATIONS

Bunshah, Deposition Technologies for Films and Coatings, Noyes Publications, Park Ridge, New Jersey, 1982.*

* cited by examiner

*Primary Examiner*—Timothy Meeks
(74) *Attorney, Agent, or Firm*—Marger Johnson & McCollom, P.C.

(57) ABSTRACT

Vacuum/gas phase reactor embodiments used in gas phase dehydroxylation and alkylation reactions are described in which the substrate could be subjected to high vacuum, heated to target temperature, and treated with silane as quickly and efficiently as possible. To better facilitate the silylation and to increase the efficiency of the process, the reactor is designed to contain quasi-catalytic surfaces which can act both as an "activator" to put species in a higher energy state or a highly activated state, and as a "scrubber" to eliminate possible poisons or reactive by-products generated in the silylation reactions. One described embodiment is a hot filament reactor having hot, preferably metallic, solid surfaces within the reactor's chamber in which wafers having mesoporous silicate films are treated. Another is an IR reactor having upper and lower quartz windows sealing the upper and lower periphery of an aluminum annulus to form a heated chamber. Finally, a flange reactor is described that includes a flange base and lid forming a tiny chamber therein for a wafer, the reactor being heated by conduction from a hot sand bath. The dehydroxylation and alkylation treatment of mesoporous silica films produces treated films exhibiting low dielectric constant and high elastic modulus.

16 Claims, 6 Drawing Sheets

VACUUM/GAS PHASE REACTOR FOR DEHYDROXYLATION AND ALKYLATION OF POROUS SILICA

RELATED APPLICATIONS

The present application is a continuation-in-part of co-pending U.S. patent application Ser. No. 09/413,062 entitled MESOPOROUS SILICA FILM FROM A SOLUTION CONTAINING A SURFACTANT AND METHODS OF MAKING SAME, filed Oct. 14, 1999 and issued Dec. 11, 2001 as U.S. Pat. No. 6,329,017, naming one or more common co-inventors herewith and assigned in common with the present application to Battelle Memorial Institute, Inc. of Richland, Wash. which is a continuation-in-part of Ser. No. 09/361,499, filed Jul. 23, 1999, now abandoned, which is a continuation-in-part of Ser. No. 09/335,210, filed Jun. 17, 1999, now abandoned, which is a continuation-in-part of Ser. No. 09/220,882, filed Dec. 23, 1998, now abandoned.

BACKGROUND OF THE INVENTION

The present invention involves reactors for dehydoxylation and alkylation of porous silicate films, as for example, mesoporous silica films on wafers or substrates. More particularly, it concerns vacuum/gas phase reactors capable of producing films exhibiting low dielectric constant (low-k) and high elastic modulus (high-E) films at relatively low temperatures that are compatible with manufacture of semiconductor interconnects.

SUMMARY OF THE INVENTION

The reaction involves the capping of polar hydroxyl groups on the surfaces of the porous silicates, which include silica and organosilicates with alkyl or alkyl silane groups resulting in a non-polar hydrophobic surface. Liquid/solution phase treatment involves dipping or soaking the substrate (typically supported on silicon wafers) in pure silane or a silane solution followed by a solution wash. Gas phase treatment is generally more efficient and involves treating the substrate with a silane or other dehydroxylating organic chemicals in the gas phase at elevated temperatures and/or reduced pressures. The substrate is exposed to vacuum prior to and after silane treatment. Such gas phase treatment is described in the above-referenced co-pending U.S. patent application Ser. No. 09/413,062 entitled MESOPOROUS SILICA FILM FROM A SOLUTION CONTAINING A SURFACTANT AND METHODS OF MAKING SAME, filed Oct. 4, 1999 and assigned in common with the present application to Battelle Memorial Institute, Inc. of Richland, Wash., the disclosure of which is incorporated herein by this reference. The greater efficiency of vacuum/gas phase silane or dehydroxylating chemical treatment (hereinafter termed "silylation") can be attributed to the greater accessibility of silane or other dehydroxylating chemicals to the hydroxyl moieties after pore evacuation, especially with pore sizes in the ten to twenty angstrom (10–20 Å) range.

Ideally, the reactor used in gas phase silylation reactions would be one in which the substrate could be subjected to high vacuum, heated to target temperature, and treated with silane as quickly and efficiently as possible.

Various reactor designs can accomplish this treatment of films. However, the specific design employed can affect the quality of the final product. To better facilitate the silylation and to increase the efficiency of the process, the reactor is designed to contain quasi-catalytic surfaces which can act both as an "activator" to put species in a higher energy state or a highly activated state, and as a "scrubber" to eliminate possible poisons or reactive by-products generated in the silylation reactions. One described embodiment is a hot filament reactor having hot, preferably metallic-solid surfaces within the reactor's chamber in which mesoporous film wafers are placed. Another is an IR reactor having upper and lower quartz windows sealing the upper and lower periphery of an aluminum annulus to form a heated chamber. Finally, a flange reactor is described that includes a flange base and lid forming a tiny chamber therein for a wafer, the reactor being heated by conduction from a hot sand bath. The silylation treatment of mesoporous films produces treated films exhibiting low dielectric constant (k) and high modulus (E).

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION OF THE INVENTION

Various styles of gas phase reactors recently have been designed. The reactors allow for the facile treatment of a substrate to high vacuum in conjunction with high-temperature, vapor-phase dehydroxylation chemical(s) or agent(s) such as silane gas (e.g. trimethyliodosilane (TMIS), hexamethyldisilazane (HMDS) or other suitable silane) or alternative, non-silane gas exposure. However, they have major design differences resulting in different product quality. Three specific embodiments of the invention, a "hot filament" reactor, an "infrared" (IR) reactor and a "flange" reactor will be described by reference to FIGS. 1A, 1B, 2A, 2B and 3A, 3C, respectively. It will be understood that not all features are visible in each perspective view of the three reactors shown in FIGS. 1B, 2B and 3B.

Figure 1A:
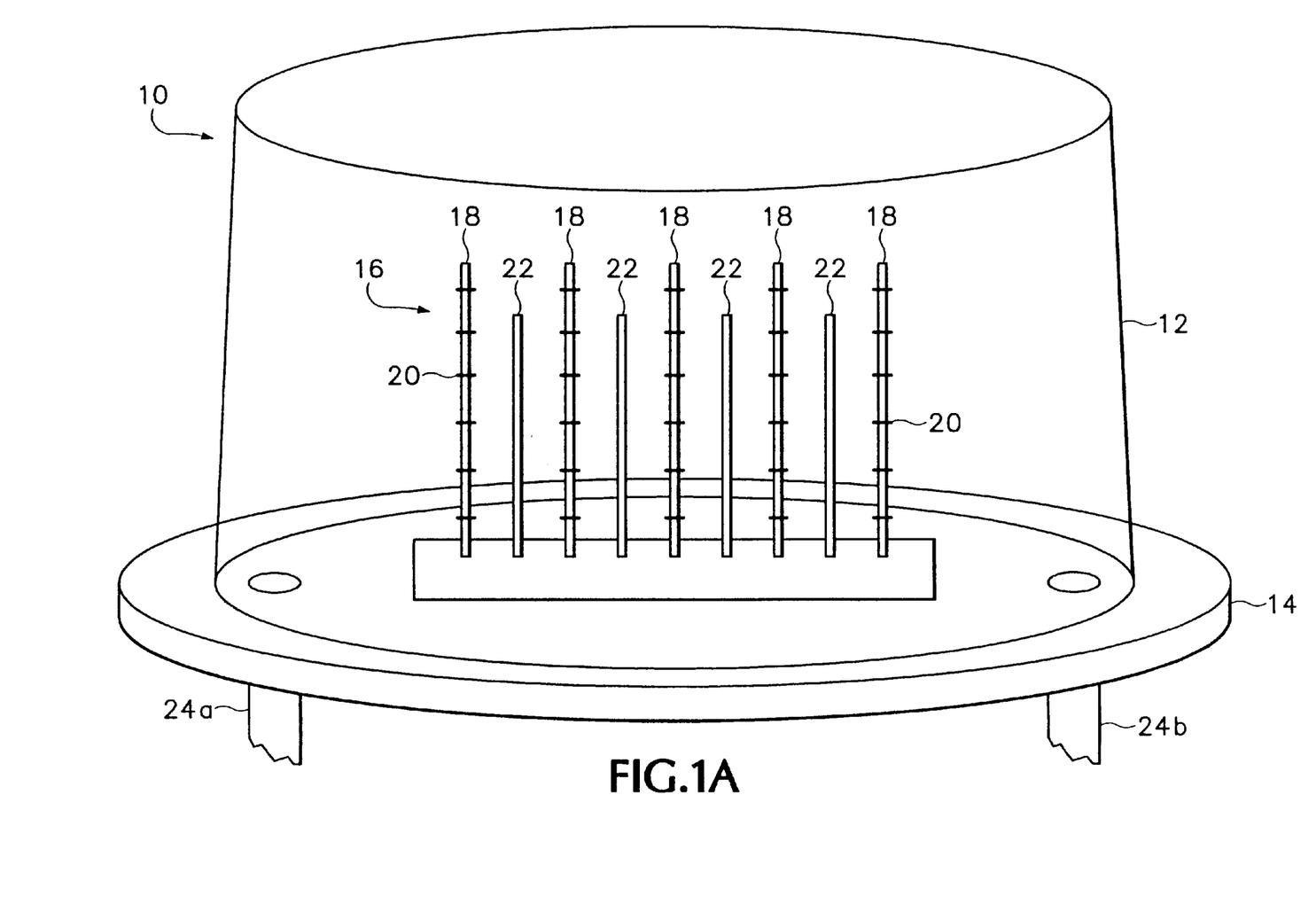
FIGS. 1A and 1B are a system block diagram and a perspective view of the invented hot-filament reactor apparatus in accordance with a preferred embodiment of the invention.
Figure 1B:
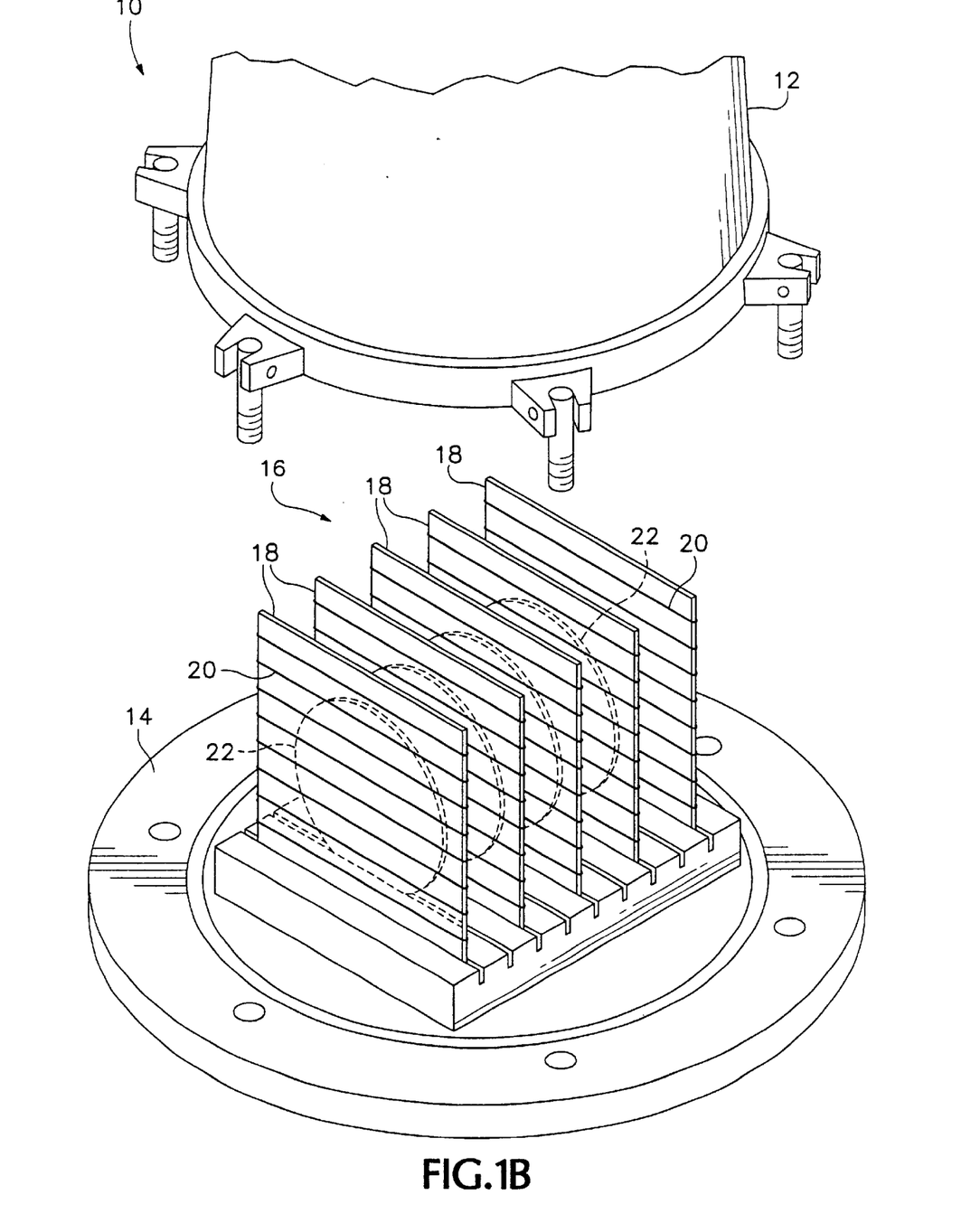

Referring first to FIGS. 1A and 1B, a hot filament reactor 10 may be seen to include an aluminum container (or vacuum vessel) 12 supported on a stainless steel base 14. The machine-slotted O-ring sealed, interior chamber 16 of the reactor consists of a plurality of equally spaced thin, thermally insulative plates 18 supporting helically wound or coiled heating elements 20 preferably of bare nichrome wire. Wafers 22 coated with dielectric film are placed between heating elements 20 and, after the chamber is evacuated, the heating elements reach a much higher temperature, e.g. greater than approximately 500° C., than that of the wafers, e.g. 350–475° C. and preferably between approximately 375° C. and 425° C. Following a high-temperature vacuum treatment, silane is introduced into chamber 16 via an inlet valve 24a. Silane is removed and the chamber is evacuated via an outlet valve 24b. In this way, the silane is heated by a) direct contact with the hot coils, b) convection, and c) radiation. In addition, as gaseous side-products are formed they also contact the hot coils. The metal surfaces of the reaction chamber, including the porous interior aluminum and stainless steel surfaces of the container and the coiled heating elements, become hot during the vacuum/silane treatment and act as scrubbers and activators to improve the dehydroxylation and alkylation process.

In the reactor 10 embodiment, chamber 16 has an approximately 21 liter (21 L) volume. The filaments are power-cycled by a controller such that they are maintained at or near a target temperature throughout the treatment. The on-off duty cycle varies between the silane vapor phase and the vacuum phases of the treatment process. Hot filament reactor 10 consumes relatively low power, e.g. only approximately 1 kilowatt (1 kW). Base 14 includes plural, spaced slots machined into its flat upper surface, as shown, to accommodate five hot coil plates 18 and four 4" diameter wafers 22 in an alternating configuration with each wafer having a hot coil plate on either. Those of skill in the art will appreciate that, within the spirit and scope of the invention, chamber 16 may be configured to accommodate one or more 8" or 12" diameter wafers by simply changing the dimensions of the reactor's vessel 12. Reactor 10 heats up to a target wafer temperature of preferably approximately 425° C. in a few minutes, and cools down in approximately 1–2 hours. A vacuum of less than approximately 50 militorr (and more preferably 1 militorr or less) is achieved in accordance with this embodiment of the invention.

Silylation of mesoporous thin films in hot filament reactor 10 produces mesoporous films exhibiting low-k (a dielectric constant less than or equal to approximately 2.1) and high-E (a modulus of greater than or equal to approximately 3.5 gigaPascals (GPa)). Importantly, these characteristics are achievable at relatively low temperatures (approximately 350–475° C.) compatible with semiconductor interconnect fabrication.

Figure 2A:
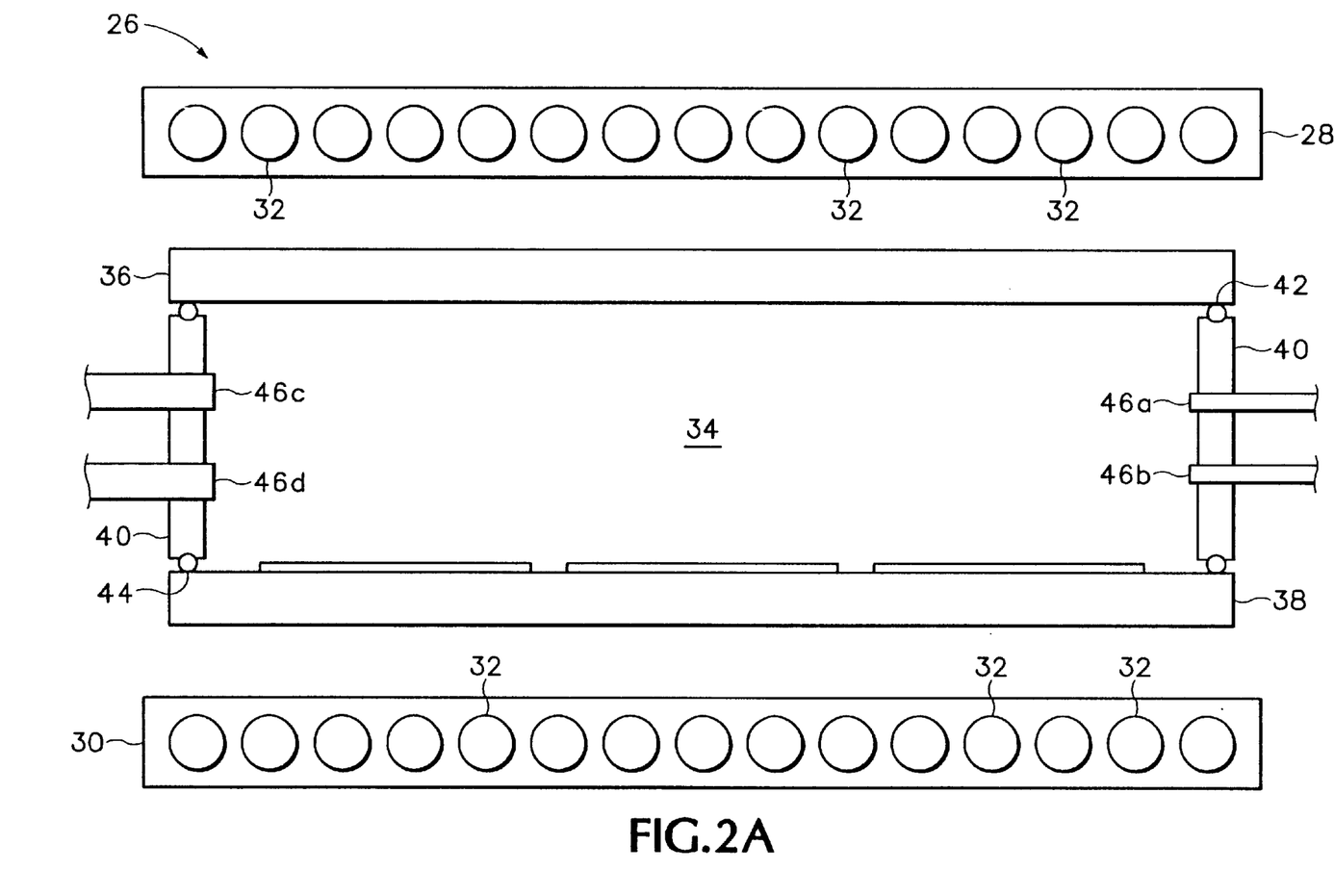
FIGS. 2A and 2B are a system block diagram and a perspective view of the invented infrared reactor apparatus in accordance with an alternative embodiment of the invention.
Figure 2B:
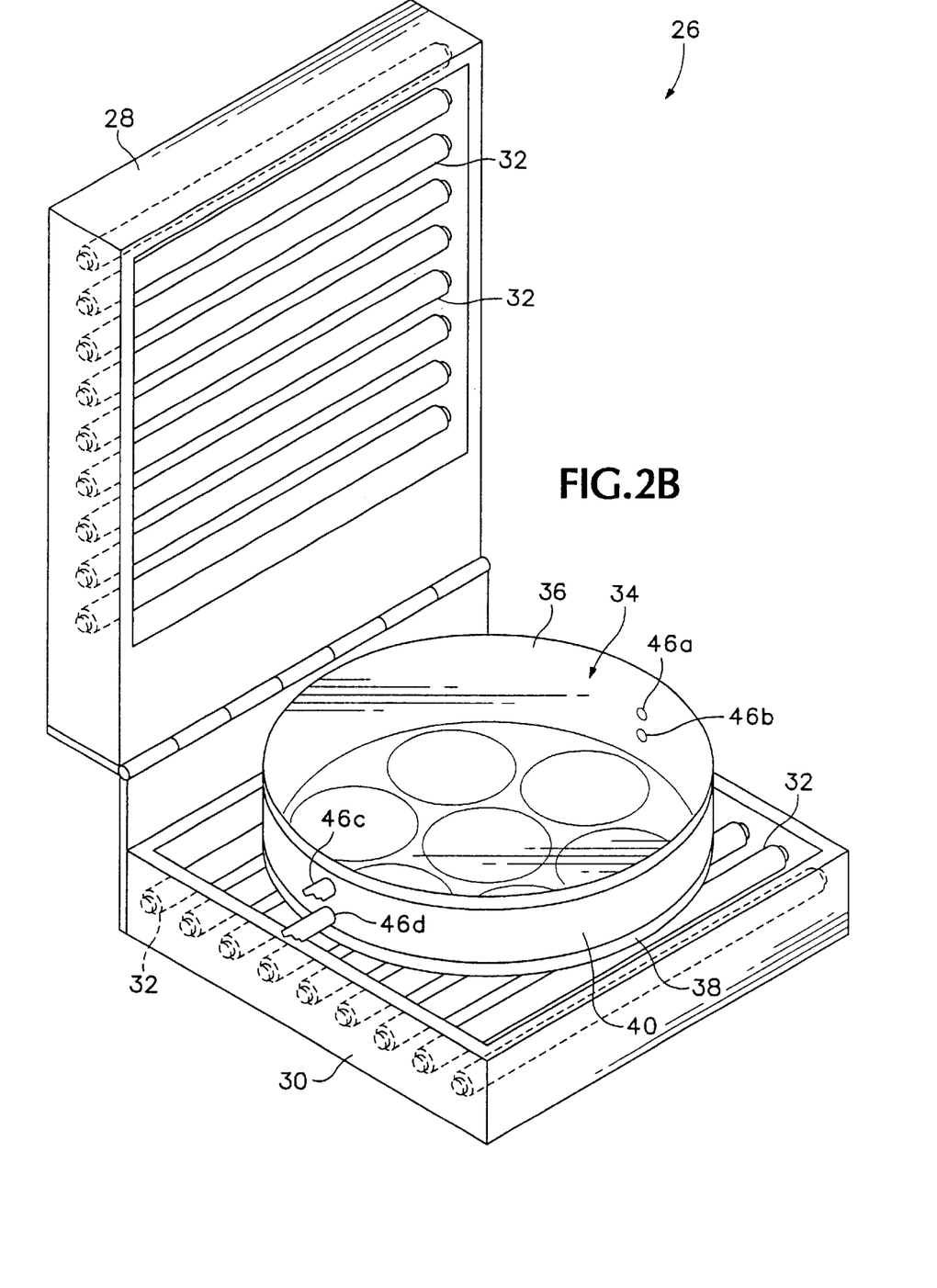

Turning briefly to FIGS. 2A and 2B, IR reactor 26 includes upper and lower arrays 28, 30 of plural (e.g. fifteen in each array) quartz tubular IR lamps 32, the arrays being directly above and below a sealed chamber 34 therebetween. Chamber 34 includes two quartz windows 36, 38 separated by a water-cooled aluminum ring 40. Quartz windows 36, 38 allow IR radiation from IR lamp arrays 28, 30 to pass directly into the chamber to be absorbed by an array of wafers 22, thereby quickly heating the wafers to a target temperature, e.g. 350–475° C. and preferably between approximately 375° and 425° C. (Those of skill in the art will appreciate that only the wafers are at high temperature). Aluminum ring 40 remained at or below ambient temperature to protect the O-ring vacuum seals 42, 44 of quartz windows 36, 38, although those of skill in the art will appreciate that aluminum ring 40 alternatively may be heated, within the spirit and scope of the invention. Following a high-temperature vacuum treatment, vapor phase silane(s) is (are) introduced into chamber 34 via two small inlet valves 46a, 46b and is exhausted via two larger outlet valves 46c, 46d. As the silane vapor enters chamber 34 it begins to condense on the cool aluminum, thereby creating a refluxing condition during the silylation treatment. The silane remains at a defined reflux temperature and pressure, e.g. conditions at which refluxing is observed through upper quartz window 36—typically between approximately 100° C. and 400° C. and more probably between approximately 200° C. and 300° C.—throughout the treatment. Other than the surfaces of the silicon wafers, no hot surfaces are present inside reaction chamber 34.

In the reactor 26 embodiment, cylindrical chamber 34 is approximately 34 cm in diameter and preferably approximately 6.5 cm deep, has an approximately 5 L volume, and can accommodate up to seven 4" diameter wafers or one 8" diameter wafer. The wafers may be supported within chamber 34 by a six-pointed star-patterned thin quartz rod structure (not shown), thereby minimizing interference with IR radiation. IR reactor 26 consumes relatively high power, approximately 11 kW, and achieves a desirably high vacuum of less than approximately $10^{-5}$ torr in minutes. It consumes a small amount of dehydroxylation chemical and produces a small amount of waste product. Heating the wafers to the target temperature, e.g. 350–475° C. and preferably approximately 425° C., takes only minutes, and seven 4" wafers arranged generally in a hexagon are heated uniformly. Cool-down time is relatively short, e.g. less than approximately 0.5 hr. Within the spirit and scope of the invention, a heated bare nichrome wire and/or a heated stainless steel coupon may be placed within the chamber of IR reactor 26 in close proximity to the wafers to perform the activation and scrubbing activities noted above, thereby producing low-k and high-E mesoporous films.

Figure 3A:
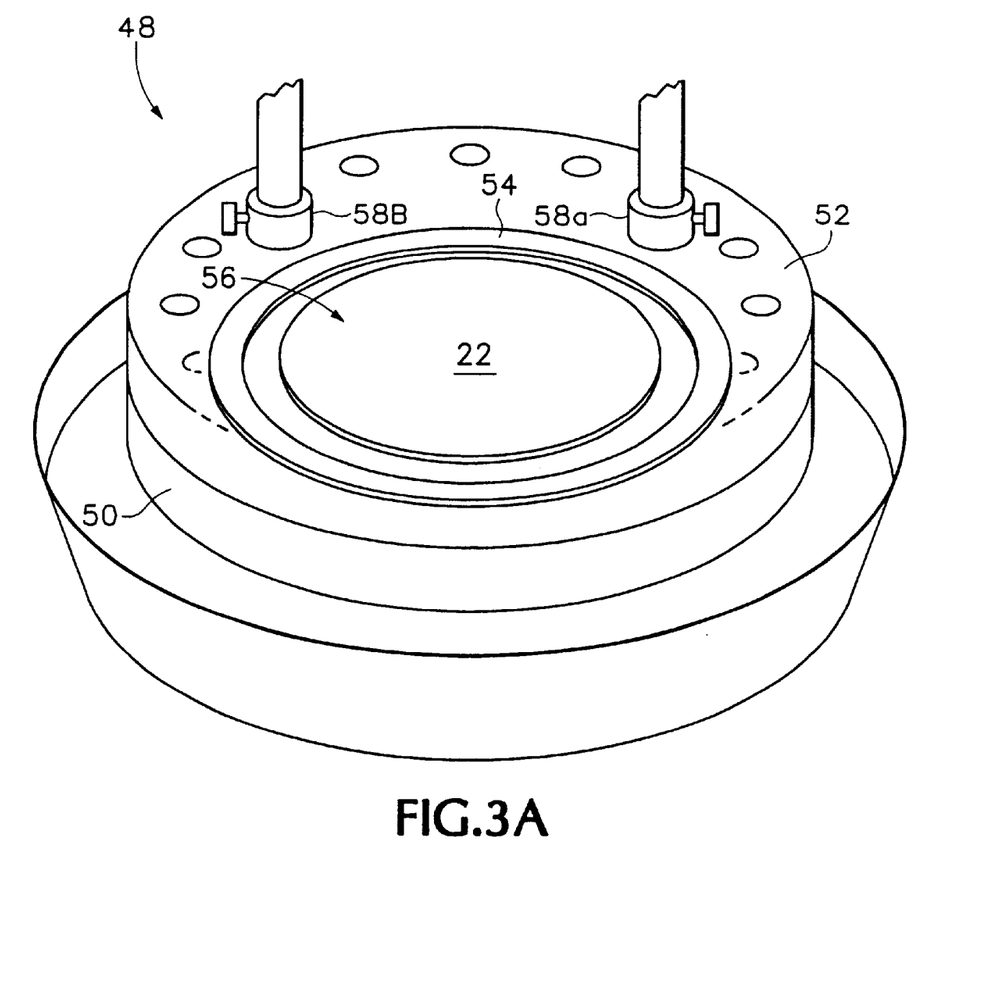
FIGS. 3A and 3B are a system block diagram of the invented flange reactor apparatus in accordance with another alternative embodiment of the invention.
Figure 3B:
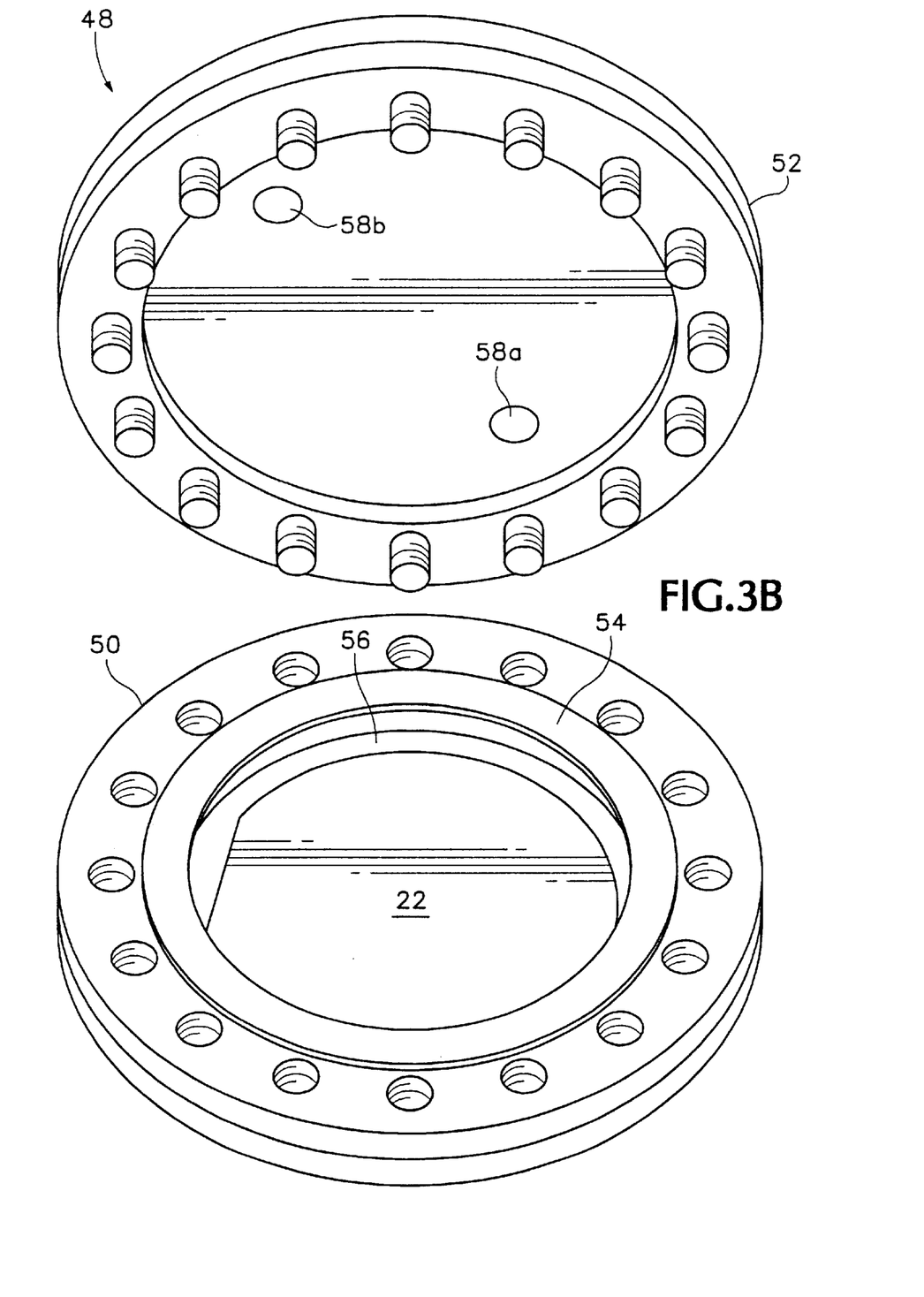

Turning very briefly now to FIGS. 3A and 3B, a flange reactor 48 includes a flange base 50 and a flange lid 52 of stainless steel and bolted together, with a metal gasket 54 (e.g. a so-called "knife edge" gasket of malleable copper (Cu)) secured therebetween for supporting a single 4" wafer 22. Flange reactor 48 is heated to achieve the same target wafer temperature, e.g. 350–475° C. and preferably approximately 425° C. by suitable means such as direct conduction through base plate 50 buried in a hot sand bath. (Those of skill in the art will appreciate that the sand bath uses a large semi-cylindrical heating mantel as a heating source, with the sand surrounding the reactor absorbing heat from such heating source.) Silane gas and a vacuum are alternately introduced into a tiny chamber 56 formed between base 50 and lid 52, within the confines of O-ring 54, via an inlet valve 58a and is exhausted via an outlet valve 58b. Those of skill in the art will appreciate that the porous interior surfaces of stainless steel base 50, lid 52 and perhaps also copper O-ring 54 are solid hot, preferably metallic, surfaces in close physical proximity to wafer 22. Thus, it will be appreciated that, in this flange reactor embodiment, like in the hot filament reactor embodiment, these solid hot surfaces may act as scrubbers and/or activators that accelerate the silylation process.

Flange reactor 48 is approximately 0.8 cm deep and chamber 56 is only approximately 0.08–0.125 L in volume. The solitary wafer within reactor 48 is heated uniformly and constantly throughout the treatment process. High vacuum is easily and quickly achieved, and very small quantities of dehydroxylation chemicals are consumed or wasted. Heat-up and cool-down times are approximately 1–2 hours each, making cycle time relatively long for each wafer. Because of the relatively small volume of chamber 56, multiple silane treatment cycles are necessary to introduce one equivalent of silane (relative to the calculated hydroxyl amount). Low-k ($k \leq$ approximately 2.0) and moderately high-E (E values between approximately 3 and 4 GPa) results on mesoporous films obtained on mesoporous silica films using flange reactor 48. In contrast to hot filament reactor 10, the proximity of the hot upper and lower stainless steel flanges (e.g. hot solid metal surfaces) to the wafer within chamber 56 in this design contribute to desirable dehydroxylation and alkylation of the mesoporous film thereon.

Those of skill in the art will appreciate that conventional controllers are provided in connection with reactors 10, 26 and 48 to control a) the inflow and removal of the dehydroxylation chemical and vacuum; b) the inflow of controlled trace concentrations of oxygen gas ($O_2$) or nitrogen gas ($N_2$); c) the pressure within the vessel; d) the temperature within the chamber or at the surface of the wafer; and/or e) the temperature of the heating elements and hot surfaces within the reactor.

The importance of what is referred to herein as a hot filament or hot solid preferably metal surfaces surrounded by dehydroxylation chemicals such as silane gas will now be explained.

Upon introduction of silane gas ($R_3SiX$ or $R_3SiNH_2$) to the substrate (wafer), surface hydroxyls undergo a replacement reaction with the silane gas.

$$R_3SiX_{(g)} + SiOH_{(s)} \rightarrow SiOSiR_{3(s)} + HX_{(g)}$$

As surface alkyl siloxane groups and HX (where X will be understood to be a suitable halogen such as bromine, iodine or chlorine) increase in concentration, a second, competing reaction typically occurs between the surface siloxyl groups and nearby surface silanols, which is catalyzed by HX.

$$SiOSiR_{3(S)} + SiOH_{(s)} \rightarrow SiOSi_{(s)} + R_3SiOH_{(g)}$$

The net result of this competing reaction is the removal of the polar hydroxyl group, without the desired alkylation of the silica surface. Allowing this process to continue results in highly dehydroxylated silica with little or no alkyl siloxane caps. Upon exposure to air of normal humidity, the porous silica reacts with water vapor to reform the polar surface hydroxyl groups.

The present invention is not limited to any particular principle of operation, as the to-be described low-k and high-E results speak for themselves. The presence of hot filament surfaces and hot solid metal surfaces in the reaction chamber can cause the HX (formed in the first dehydroxylation reaction) to be quickly and efficiently scavenged, forming diatomic iodine and hydrogen, thereby decreasing the rate at which the secondary, competing reaction occurs and leaving the film in the desired highly dehydroxylated state with alkyl siloxane caps.

Direct contact with the heating elements increases the average kinetic energy of the silane, thus potentially increasing the rate of initial substitution reaction. The presence of the hot filaments or hot solid metal surfaces can catalyze the formation of highly reactive intermediate species such as silenium cations, which could substantially accelerate the silylation process. The hot catalytic surfaces could include, for example, metallic, ceramic, graphite or polytetrafluoroethylene. The use of other hot catalytic surfaces is contemplated, within the spirit and scope of the invention.

The exact determination of transient vapor phase species within the reactor is not possible with conventional analytical techniques. In support of the above hypotheses, films were fabricated and treated in the model reactors, and key properties were measured. The dielectric constant, refractive index, and X-ray photoelectron spectroscopy (XPS) measurements were conducted on product produced in hot filament reactor 10 and IR reactor 26. For comparative purposes, extreme measures were taken to ensure that substrates treated in each reactor were identical prior to the dehydroxylation process. Those of skill in the art will appreciate that XPS measurements enable one to analyze the carbon content of the mesoporous film and refractive index measurements enable one to determine the porosity thereof, which preferably must be more than approximately 50–60% to achieve the demonstrated low-k results.

For a given porous silica film using a surfactant to template porosity, the hot filament reactor has produced a number of samples with dielectric constants (k) of 2.0 or less and a modulus (E) of 4.0 GPa or more, while the IR reactor has not produced films with an elastic modulus (E) of over 4.0 GPa and a dielectric constant (k) of less than 2.0. Nevertheless, the IR reactor has produced dielectric constants (k) as low as 2.0 or less and moduli (E) as high as approximately 3.0 GPa. The flange reactor has also produced samples with dielectric constants (k) as low as 2.0 or less and a modulus (E) as high as approximately 3.4 GPa.

Within the spirit and scope of the invention, the IR reactor can be modified to better simulate reaction mechanisms occurring in the hot filament reactor. The first modification would be the placement of a hot nichrome wire inside the silylation chamber during treatment. The hot wire would not be used primarily to heat the substrate. It would instead be used as a silane activator and an acid scrubber. Additionally or alternatively, several small reservoirs containing solid calcium carbonate (or alternative alakaline (basic) material) could be placed inside the reactor vessel to act as an acid scrubber. Further, it would be possible as suggested above to modify the IR reactor disclosed herein to heat the aluminum ring or an internally suspended stainless steel coupon, thereby providing a scrubber function similar to the hot filament reactor.

The dehydroxylation treatment with either of these reactor chambers typically involves alternate treatments in vacuum and the dehydroxylating chemical environment. Those of skill in the art will appreciate that a vacuum is any pressure less than 1 atmosphere, and so vacuum needs to be better defined. A desirable reactor chamber vacuum pressure in accordance with the present invention is on the order of 1 torr or less. Such a vacuum is not what is typically considered a high-vacuum ($10^{-5}$–$10^{-7}$ torr) and is certainly not what is typically considered an ultra-high-vacuum ($10^{-8}$–$10^{-12}$ torr or higher). A modest vacuum as described may permit more convection heating of the dehydroxlyation chemical or agent, e.g. silane. Through control of the vacuum, no more than a trace amount of $O_2$ is maintained in the chamber. Instead of alternately charging the reactor chamber with a dehydroxylation chemical vapor and a vacuum, under certain conditions alternately charging the reactor chamber with a dehydroxylation chemical vapor and a flushing inert gas, e.g. $N_2$, is desirable. These alternatives to a vacuum phase in this silylation treatment are within the spirit and scope of the invention.

Table I below illustrates the measured results of treating silica mesoporous films using the various reactors described above for dehydroxylation and alkylation. Those of skill in the art will appreciate that the invented dehydroxylation and alkylation, e.g. silylation, treatment follows preparation and calcination of the films, preferably in accordance with the above-referenced patent teachings, or by any other suitable technique.

TABLE I

Summary of Dielectric Constant and Elastic Modulus for Mesoporous Silica Films after Dehydroxylation Treatment in Various Reactors
All surfactant-templated films first calcined in air to remove surfactant and then treated at 425° C. (wafer temperature) in iodotrimethylsilane (ITMS) three times with alternating vacuum treatments.

| Reactor Type | Sample Identification | Calcination Treatment | Modulus GPa | Dielectric Constant | $k_{air} - k_{n2}$* |
|---|---|---|---|---|---|
| Flange | 57168-9-4 | 425° C. 5 min | 3.2 | 2.17 | 0.17 |
| Hot Filament | 13456-99-3 | 150° C. 2 min + 425° C. 2 min | 4.4 | 2.05 | 0.03 |
| Hot Filament | 57137-123-4-A | 425° C. 5 min | 4 | 2.09 | 0.12 |
| IR | 13773-109-S3-1 | 150° C. 2 min + 425° C. 2 min | 3 | 2.31 | 0.09 |
| IR | 13773-109-S3-3 | 425° C. 5 min | 2.8 | 2.24 | 0.12 |

Table I is believed to be understandable to those of skill in the art. The films are calcined either at 150° C. for two minutes and 425° C. for two minutes (referred to herein as 2+2), or at 425° C. for five minutes (referred to herein as 5+0). It is noted that the flange reactor produced a treated film having a dielectric constant as low as 2.17 and an elastic modulus as high as 3.2 GPa; that the IR reactor produced a treated film having a dielectric constant as low as 2.31 and an elastic modulus as high as 3 GPa; and that the hot filament reactor produced a treated film having a dielectric constant as low as 2.05 and an elastic modulus as high as 4.4 GPa. Elastic modulus (E) was measured using conventional equipment that indents the film to varying depths below the surface. Referring to the right column of Table I, those of skill in the art will appreciate that, the smaller the difference between $k_{air}$ and $k_{N2}$, the greater the hydrophobicity of the film, and it is noted that this desirable result occurs at higher silylation temperatures.
Abiant air including normal relation humidities.

Those of skill in the art will appreciate that the mesoporous film prepared in accordance with the 0+5 calcination process and the dehydroxylation/silylation treatment in the reactor has a dielectric constant of as low as approximately 2.0 obtained over a range of silylation temperature.

Two or more silylation cycles (each cycle including a silane gas vapor or other dehydroxylation chemical phase followed by a vacuum phase) produce a significantly lower dielectric constant than a single cycle. Thus, multiple silylation cycles could be desirable, but there may be an upper limit on the number of cycles, if the dielectric constant is to remain desirably low without excessive build-up of carbon-rich organic groups in the pores of the film.

Accordingly, the invented dehydroxylation and alkylation reactors and processes described herein can produce silica mesoporous films having low dielectric constants and high moduli for use in the semiconductor interconnect fabrication field and other related applications requiring structurally durable low-k films on substrates.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A low-temperature method of dehydroxylating a mesoporous film on a substrate, the method comprising:

placing the substrate in a reactor in physical proximity to a high-thermal capacity filament heated by an electricity source, the filament being contained within the reactor;

alternately charging the reactor with a vapor-phase dehydroxylating agent above a defined pressure and a vacuum below a defined pressure;

heating the filament to a temperature high enough to energize the dehydroxylating agent and low enough to not damage the substrate; and inducing a reaction of the energized vapor-phase dehydroxylating agent with the mesoporous film on the substrate.

2. The method of claim 1, wherein said heating is to a temperature measured at a surface of the substrate of between approximately 350° and 475° C.

3. The method of claim 2, wherein said heating is to a temperature measured at a surface of the substrate of between approximately 375° C. and 425° C.

4. The method of claim 1, wherein the vapor-phase dehydroxylation agent includes a reaction silane.

5. The method of claim 1, wherein the filament is metallic.

6. The method of claim 1, wherein said alternate charging with dehydroxylation agent and vacuum is repeated at least once.

7. The method of claim 1, wherein said alternate charging is approximately equally timed between that of the dehydroxylation agent and that of the vacuum.

8. The method of claim 1, wherein said alternate charging includes charging with the dehydroxylation chemical for between approximately 2.5 and 15.0 minutes and charging with the vacuum for between approximately 2.5 and 15.0 minutes.

9. The method of claim 1, wherein said charging with the dehydroxylation agent is to a pressure of more than proximately 1 torr.

10. The method of claim 9, wherein said charging with the vacuum is to a pressure of between approximately $10^{-3}$ torr and 1 torr.

11. The method of claim 10, wherein said charging with the vacuum is to a pressure of between approximately $10^{-2}$ torr and 1 torr.

12. The method of claim 1, wherein a mesoporous film dehydroxylated by said method is characterized by a dielectric constant of below approximately 2.3 and an elastic modulus of above approximately 3.0 GPa.

13. The method of claim 12, wherein the dehydroxylated mesoporous film is characterized by a dielectric constant of below approximately 2.1 and an elastic modulus of above approximately 4.0 GPa.

14. A low-temperature method of dehydroxylating a mesoporous film on a substrate, the method comprising placing the substrate in a reactor in physical proximity to a solid object also contained within the reactor;

alternately charging the reactor with a vapor-phase dehydroxylating agent above a defined pressure and a vacuum below a defined pressure;

raising the temperature of the solid object to produce a temperature within the reactor and around the substrate high enough to enable the dehydroxylating agent to react with the mesoporous film and low enough to not damage the film.

15. The method of claim 14, wherein a mesoporous film dehydroxylated by said method is characterized by a dielectric constant of below approximately 2.3 and an elastic modulus of above approximately 3.0 GPa.

16. The method of claim 15, wherein the dehydroxylated mesoporous film is characterized by a dielectric constant of below approximately 2.1 and an elastic modulus of above approximately 4.0 GPa.

* * * * *

UNITED STATES PATENT AND TRADEMARK OFFICE
CERTIFICATE OF CORRECTION

PATENT NO.    : 6,548,113 B1
DATED         : April 15, 2003
INVENTOR(S)   : Birnbaum et al.

It is certified that error appears in the above-identified patent and that said Letters Patent is hereby corrected as shown below:

Column 1,
Line 10, "Oct. 14, 1999" should read -- Oct. 4, 1999 --.

Column 6,
Line 47, "$10^-_8$-$10^{-12}$" should read -- $10^{-8}$-$10^{-12}$ --.

Column 8,
Lines 41-42, "proximately" should read -- approximately --.

Signed and Sealed this

Twenty-first Day of October, 2003

JAMES E. ROGAN
*Director of the United States Patent and Trademark Office*